(12) United States Patent
Huynh Bao et al.

(10) Patent No.: US 10,332,588 B2
(45) Date of Patent: Jun. 25, 2019

(54) STATIC RANDOM ACCESS MEMORY DEVICE HAVING INTERCONNECTED STACKS OF TRANSISTORS

(71) Applicants: IMEC VZW, Leuven (BE); Vrije Universiteit Brussel, Brussels (BE)

(72) Inventors: Trong Huynh Bao, Leuven (BE); Julien Ryckaert, Schaerbeek (BE); Praveen Raghavan, Leefdaal (BE); Pieter Weckx, Bunsbeek (BE)

(73) Assignees: IMEC vzw, Leuven (BE); Vrije Universiteit Brussel, Brussels (BE)

( * ) Notice: Subject to any disclaimer, the term of this patent is extended or adjusted under 35 U.S.C. 154(b) by 0 days.

(21) Appl. No.: 15/851,531

(22) Filed: Dec. 21, 2017

(65) Prior Publication Data

US 2018/0174642 A1    Jun. 21, 2018

(30) Foreign Application Priority Data

Dec. 21, 2016  (EP) .................................... 16205696

(51) Int. Cl.
*G11C 11/412* (2006.01)
*H01L 27/11* (2006.01)
(Continued)

(52) U.S. Cl.
CPC ........ *G11C 11/412* (2013.01); *G11C 11/4085* (2013.01); *H01L 27/0688* (2013.01);
(Continued)

(58) Field of Classification Search
CPC ............... G11C 11/412; G11C 11/4085; H01L 27/0688; H01L 29/0673; H01L 27/1104;
(Continued)

(56) References Cited

U.S. PATENT DOCUMENTS 9,935,204 B2 *  4/2018  Lee ..................... H01L 27/1104
2008/0023728 A1  1/2008  Jang et al.
(Continued)

OTHER PUBLICATIONS

Huang, et al: "6-T SRAM performance assessment with stacked silicon nanowire MOSFETs", Sixteenth International Symposium on Quality Electronic Design, IEEE, Mar. 2, 2015 (Mar. 2, 2015), pp. 610-614.
(Continued)

*Primary Examiner* — David Lam
(74) *Attorney, Agent, or Firm* — Knobbe, Martens, Olson & Bear LLP (57) ABSTRACT

In an aspect of the disclosed technology, a SRAM device includes a first stack of transistors and a second stack of transistors arranged on a substrate. Each of the first and second stacks includes a pull-up transistor, a pull-down transistor and a pass transistor, where each of the transistors includes a horizontally extending channel. In each of the first and second stacks, the pull-up transistor and the pull-down transistor have a common gate electrode extending vertically therebetween, and the pass transistor has a gate electrode separated from the common gate electrode. A source/drain of each of the pull-up transistor and the pull-down transistor and a source/drain of the pass transistor included in one of the first stack and the second stack are electrically interconnected with the common gate electrode of the pull-up transistor and the pull-down transistor included in the other of the first stack and the second stack.

18 Claims, 6 Drawing Sheets

(51) Int. Cl.
  *H01L 29/423*    (2006.01)
  *G11C 11/408*    (2006.01)
  *H01L 29/08*     (2006.01)
  *H01L 27/06*     (2006.01)
  *H01L 29/06*     (2006.01)

(52) U.S. Cl.
  CPC ...... *H01L 27/1104* (2013.01); *H01L 27/1116* (2013.01); *H01L 29/0673* (2013.01); *H01L 29/0847* (2013.01); *H01L 29/42392* (2013.01)

(58) Field of Classification Search
  CPC ........... H01L 27/1116; H01L 29/42392; H01L 29/0847
  See application file for complete search history.

(56) References Cited

U.S. PATENT DOCUMENTS

| | | |
|---|---|---|
| 2009/0020817 A1 | 1/2009 | Park et al. |
| 2011/0031473 A1 | 2/2011 | Chang et al. |
| 2014/0312426 A1 | 10/2014 | Balakrishnan et al. |

OTHER PUBLICATIONS

European Patent Office Search Report for Application No. 16205696.4 dated Jun. 16, 2017; 9 pages.

* cited by examiner

STATIC RANDOM ACCESS MEMORY DEVICE HAVING INTERCONNECTED STACKS OF TRANSISTORS

CROSS-REFERENCE TO RELATED APPLICATIONS

This application claims foreign priority to European Patent Application No. 16205696.4, filed Dec. 21, 2016, the content of which is incorporated by reference herein in its entirety.

BACKGROUND

Field

The disclosed technology generally relates to semiconductor memory devices, and more particularly to static random access memory (SRAM) device.

Description of the Related Technology

The development of transistors of ever decreasing dimensions is an enabler for the semiconductor industry. In memory technologies, smaller transistors enable reduced memory bit cell area, which in turn enables increased bit density. A type of transistors that enable continued scaling presently and are expected to continue to enable scaling in the future include transistors having nanowire-based channels. Some transistors having nanowire-based channels can allow, among other things, reduced gate lengths, which can in turn enable, among other things, faster switching speeds while suffering comparatively less from detrimental impact of scaling, e.g., short channel effects, compared to planar devices.

In conventional SRAM technology, the bit cells occupy a relatively large portion of the total die surface area. The scaling trend for SRAM bit cell area based on conventional industrial CMOS technology, including 45 nm technology node to 14 nm technology node, has been following an empirical trend known as Moore's Law, based on which transistors on average undergo approximately a 2 times area reduction per technology node or generation, or conversely, semiconductor chips undergo a 2 times increase of circuit density per technology node or generation. In some technologies, the technology node corresponds to at least one minimum dimension, e.g., gate length of a transistor. From the 14 nm technology node and below, however, the scaling rate for SRAMs manufactured using device and fabrication technologies currently available is expected to slow and/or deviate from the prior 2 times area reduction p.

SUMMARY OF CERTAIN INVENTIVE ASPECTS

In view of the above, an objective of the disclosed technology is to provide a bit cell process architecture for an SRAM which allows for continued and further scaling of the SRAM/bit cell area and circuit density. Additional and alternative objectives may be understood from the following.

According to a first aspect of the disclosed technology, there is provided a bit cell for a Static Random Access Memory, SRAM, the bit cell comprising: a first and a second vertical stack of transistors arranged on a substrate, each stack including: a pull-up transistor, a pull-down transistor and a pass transistor, each transistor including a horizontally extending channel, the pull-up transistor and the pull-down transistor having a common gate electrode extending vertically between the pull-up transistor and the pull-down transistor and the pass transistor having a gate electrode being separate from the common gate electrode, wherein a source/drain of the pull-up transistor and of the pull-down transistor of the first stack, a source/drain of the pass transistor of the first stack and the common gate electrode of the pull-up and pull-down transistors of the second stack are electrically interconnected, and wherein a source/drain of the pull-up transistor and of the pull-down transistor of the second stack, a source/drain of the pass transistor of the second stack and the common gate electrode of the pull-up and pull-down transistors of the first stack are electrically interconnected.

The inventive bit cell enables scaling of the SRAM/bit cell area and circuit density by employing the vertical dimension for stacking the pull-up transistor and the pull-down transistor. Moreover, also the pass transistors are arranged to form part of their respective stack. The provision of the pass transistors need hence not increase the substrate area occupied by the bit cell.

By "a vertical stack of transistors" is hereby meant a configuration or arrangement of transistors at different levels above, or different distances from, the substrate, as viewed along a normal direction to a main surface/main plane of extension of the substrate.

In an SRAM bit cell, the gates of the pull-up and pull-down transistors of each half-cell are electrically interconnected. The inventive bit cell implements this in that a gate electrode is arranged to be common for or shared by the stacked pull-up and pull-down transistor. This contributes to the area efficiency of the bit cell and enables rational manufacturing.

Each common gate electrode forms a single physical electrode, extending vertically between the pull-up transistor and the pull-down transistor of the associated transistor stack. Each common gate electrode may extend at least between the channels of the transistors of the associated stack of transistors The pull-up transistor and the pull-down transistor of the first stack (or the second stack), by having a common gate electrode and electrically interconnected source/drains, are configured as a first inverter (or a second inverter). By the source/drains of the pull-up transistor and the pull-down transistor of the first stack (or the second stack) being electrically interconnected with the common gate electrode of the second stack (or the first stack), the first inverter and the second inverter are configured as a pair of cross-coupled inverters.

The afore-mentioned transistors of the first and second stack may be field-effect transistors (FETs). The pull-up transistor of each stack may be a p-type FET. The channel of the pull-up transistor may be a p-type channel. The pull-down transistor of each stack may be an n-type FET. The channel of the pull-down transistor may be an n-type channel. The pull-up transistor and the pull-down transistor of the first stack (or the second stack) may be referred to as a vertical complementary FET pair (a VCFET device). The pass transistor of each stack may be an n-type FET. The channel of the pass transistor may be an n-type channel.

The designation "pull-up", "pull-down" or "pass" of a transistor of the stacks should herein be construed as the transistor being adapted to function or operate, or suitable for functioning or operating, as a pull-up, pull-down or pass transistor in the context of the conventional understanding of (CMOS) inverters or SRAM bit cells.

A "source/drain" of a transistor may refer to either a source region or a drain region of a transistor. Whether the region acts as a "source" or "drain" is as understood by the skilled person dependent on the type of transistor (i.e. a transistor with a n- or p-type channel) and the voltages applied to the device in use.

The common gate electrode of the pull-up and pull-down transistors of each stack and the gate electrode of the pass transistor are separate, or physically separate from each other. In other words, the electrodes are spaced apart from each other. Thereby, no direct electrical connection exists between the electrodes within the bit cell.

As used herein, the terminology "electrical (inter-)connection" between elements or elements being "electrically (inter-)connected" should be understood as presence of a galvanic connection between the elements. In other words, a conducting structure is arranged in physical contact with the elements wherein the elements are electrically connected, or the elements are arranged in contact/abutment with each other to be directly electrically connected. Conversely, two elements being electrically isolated from each other should be understood as absence of an electrical or galvanic connection between the elements.

Each transistor of the first and the second stack may include a horizontally extending nanostructure including a channel portion. Nanostructure-based transistors enable area-efficient devices with desirable electrical characteristics in terms of device control and standby leakage. Forming channels in horizontal nanostructures also provide a process-related advantage in that such structures may be rationally and reliably manufactured by selective etching of layers of super lattice structures, i.e. structures including alternating layers of different semiconductor materials.

One or more of the common gate electrode of the pull-up and pull-down transistors of the first/second stack and of the separate gate electrode of the pass transistor of the first/second stack may be arranged to at least partially enclose, wrap around or surround the channel(s) of the associated transistor(s). Enclosing here refers to an extension of a gate electrode along at least a part of channel (or a nanostructure including the channel) in a circumferential direction thereof. The enclosing may be partial. The enclosing may be complete. A gate electrode may accordingly wrap-around the respective channel thereof. Such a gate electrode may be referred to as a gate-all around electrode.

The transistors may correspondingly be referred to as gate-all around transistors. The transistors of the bit cell, and hence the bit cell, may thus present desirable electrical characteristics in terms of device control and standby leakage.

The bit cell may further comprise a common first source/drain contact connected to the source/drain of each of the pull-up transistor, the pull-down transistor and the pass transistor of the first stack, and a common second source/drain contact connected to the source/drain of each of the pull-up transistor, the pull-down transistor and the pass transistor of the second stack. The source/drains of the pull-up, pull-down and pass transistors of each stack may thereby be conveniently interconnected.

The common first source/drain contact may be a metal source/drain contact. The common second source/drain contact may be a metal source/drain contact. This enables low-resistance devices and a rational manufacture of the bit cell.

As used herein, the term "metal" refers to a metal formed by a single type of metal element, or to a metal alloy, i.e. a mixture of a metal and another element.

The first source/drain contact may be arranged to at least partially enclose, surround or wrap-around at least a portion of the source/drain of each of the transistors of the first stack. Thereby a large interface may be achieved between the source/drains and the common first source/drain contact, thus lowering a resistance. Correspondingly, the second source/drain contact may be arranged to at least partially enclose, surround or wrap-around at least a portion of the source/drain of each of the transistors of the second stack.

The common first source/drain contact may more generally be arranged in electrical and physical contact with at least a portion of the source/drain of each of the transistors of the first stack. The first source/drain contact may abut on the source/drain of each of the transistors of the first stack. Correspondingly, the common second source/drain contact may be arranged in electrical and physical contact with at least a portion of the source/drain of each of the transistors of the second stack. The second source/drain contact may abut on the source/drain of each of the transistors of the second stack.

The first source/drain contact may extend vertically, at least between the vertical levels of the channels of the transistors of the first stack of transistors. The first source/drain contact may be arranged adjacent to the first stack of transistors. The second source/drain contact may extend vertically, at least between the vertical levels of the channels of the transistors of the second stack. The second source/drain contact may be arranged adjacent to the second stack of transistors.

The bit cell may further comprise a first interconnect connecting the common first source/drain contact to the common gate electrode of the transistors of the second stack, and a second interconnect connecting the common second source/drain contact to the common gate electrode of the transistors of the first stack. A cross-coupling may hence be achieved within the bit cell, without requiring interconnection of lines in higher metallization levels. This may also facilitate fabrication since the common gate electrode and the common source/drain contact may be processed separately and thereafter be interconnected by a separately formed interconnects.

The first interconnect may be a first metal interconnect. The second interconnect may be a second metal interconnect. A low-resistance cross-coupling may hence be achieved within the bit cell.

The first interconnect may be arranged in electrical and physical contact with the common first source/drain contact and the common gate electrode of the transistors of the second stack. The second interconnect may be arranged in electrical and physical contact with the common second source/drain contact and the common gate electrode of the transistors of the first stack.

The first interconnect (which also may be referred to as a first cross-coupler) may be arranged to abut on, i.e. engage the common first source/drain contact and the common gate electrode of the transistors of the second stack. The first interconnect may be arranged to abut on an upper surface of the common gate electrode of the transistors of the second stack. The first interconnect may be arranged to abut on a sidewall surface of the common first source/drain contact.

The second interconnect (which also may be referred to as a second cross-coupler) may be arranged to abut on, i.e. engage the common second source/drain contact and the common gate electrode of the transistors of the first stack. The second interconnect may be arranged to abut on an upper surface of the common gate electrode of the transistors of the first stack. The second interconnect may be arranged to abut on a sidewall surface of the common second source/drain contact.

The gate electrode of the pass transistor of the first stack may be separated by an insulator from the common gate electrode of the pull-up transistor and the pull-down transistor of the first stack. The gate voltage of the pass transistor and the common gate voltage of the pull-up and pull-down transistors of the first stack may accordingly be arranged to be independently controllable. Correspondingly, the gate electrode of the pass transistor of the second stack may be separated by an insulator from the common gate electrode of the pull-up transistor and the pull-down transistor of the second stack. The insulator between the common gate electrode and the separate gate electrode of the first stack and the insulator between the common gate electrode and the separate gate electrode of the second stack may be arranged at a same level above the substrate. This enables a symmetrical physical configuration of the bit cell. It may further simplify fabrication of the bit cell.

"At a same level above the substrate" should be understood as at a same distance from (a main surface of) the substrate, as seen in the normal direction of the substrate.

The channel of each transistor of the first stack may be arranged at a same level above the substrate as a channel of one of the transistors of the second stack. This enables a symmetrical physical configuration of the bit cell. It may further simplify fabrication of the bit cell.

The pull-up transistor of the first stack may be arranged at a same level as the pull-up transistor of the second stack. The pull down transistor of the first stack may be arranged at a same level as the pull-down transistor of the second stack. The pass transistor of the first stack may be arranged at a same level as the pass transistor of the second stack.

The pass transistor of the first stack may be arranged above the pull-up transistor and the pull-down transistor of the first stack, as seen in a vertical direction or a normal direction to the substrate. This may facilitate integration of the bit cell in a memory array of an SRAM since the pass transistor may be arranged above the pull-up and pull-down transistors and conveniently may be connected to a bit line and a word line arranged in one or more metallization levels above the bit cell. Correspondingly, the pass transistor of the second stack may be arranged above the pull-up transistor and the pull-down transistor of the second stack.

For each transistor stack, a vertical distance between the channel of the pass transistor of the stack and the channel of an upper most one of the channel of the pull-up transistor and the pull-down transistor of the stack, is greater than a vertical distance between the channels of the pull-up transistor and the pull-down transistor of the stack. This facilitates forming of a gate electrode of the pass transistor which is separate from the common gate electrode of the pull-up and pull-down transistors.

The gate electrode of the pass transistor of the first stack may be arranged above the common gate electrode of the pull-up transistor and the pull-down transistor of the first stack, i.e. as seen in a vertical or normal direction to the substrate. In line with the above reasoning, this may facilitate connecting the gate electrode of the pass transistor with a word line of a memory array of an SRAM. Correspondingly, the gate electrode of the pass transistor of the second stack may be arranged above the common gate electrode of the pull-up transistor and the pull-down transistor of the second stack.

The channels of the transistors of the first stack may be arranged in a common first geometrical plane which is parallel to a normal direction of the substrate. This may enable efficient device fabrication since an aligned set of horizontal nanostructure channels may be formed by etching of a fin-shaped super lattice structure. Correspondingly, the channels of the transistors of the second stack may be arranged in a common second geometrical plane which is parallel to a normal direction of the substrate.

The common first and second geometrical planes may be parallel to each other and displaced in relation to each other. This enables a further improvement of the area efficiency of the bit cell. This also enables efficient fabrication since such channels may be formed by etching of a pair of parallel fin-shaped super lattice structure.

Each transistor of the first/second stack may include a nanostructure including a channel portion and the nanostructures may extend in (i.e. parallel to) a first horizontal direction (parallel to the first/second geometrical planes). The nanostructures of the transistors of the first stack may accordingly be displaced with respect to the nanostructures of the second stack in a second horizontal direction which is perpendicular to the first horizontal direction. This enables efficient fabrication since such nanostructures may be formed by etching of a pair of parallel fin-shaped super lattice structure.

The extension in the first horizontal direction here refers to an orientation or a direction of a nanostructure. A horizontal direction here refers to a direction which is perpendicular to the vertical direction. Thus a horizontal direction is parallel to a main surface/main plane of extension of the substrate.

The bit cell may further comprise a common first source/drain contact connected to the source/drain of each of the pull-up transistor, the pull-down transistor and the pass transistor of the first stack, and a common second source/drain contact connected to the source/drain of each of the pull-up transistor, the pull-down transistor and the pass transistor of the second stack, wherein the common first source/drain contact and the common second source/drain contact are arranged between the common gate of the pull-up transistor and the pull-down transistor of the first stack and the common gate of the pull-up transistor and the pull-down transistor of the second stack, as viewed along the first horizontal direction, the direction being parallel to the first and second geometrical planes.

This enables a further improvement in the area efficiency of the bit cell. By the channels of the transistors of the first stack being displaced with respect to the channels of the second stack, the common first source/drain contact and the common second source/drain contact may be aligned in the second direction (i.e. arranged on a same geometrical line extending in the second direction). The first and second source/drain contacts may thereby be physically separated without requiring an increased dimension/separation in the first direction.

The common gate electrode of the pull-up and pull-down transistors of the first stack may extend to intersect the second geometrical plane. The common gate electrode of the pull-up and pull-down transistors of the second stack may extend to intersect the first geometrical plane. In other words, the common gate electrode of the pull-up and pull-down transistors of the first/second stack may extend along the second horizontal direction to at least partially overlap the common second/first source/drain contact as viewed in the first horizontal direction. In other words, at least a portion of the common second source/drain contact may be aligned with at least a portion of the common gate electrode of the pull-up and pull-down transistors of the first stack, as viewed in the first horizontal direction. This arrangement may facilitate the interconnection of the common gate and the source/drain electrode.

The common gate electrode of the pull-up and pull-down transistors of the first stack may be arranged in electrical and physical contact with: an end portion of a nanostructure of the pull-up transistor of the second stack, which nanostructure includes a channel portion of the pull-up transistor, and an end portion of a nanostructure of the pull-down transistor of the second stack, which nanostructure includes a channel portion of the pull-down transistor.

The common gate electrode of the pull-up and pull-down transistors of the second stack may be arranged in electrical and physical contact with: an end portion of a nanostructure of the pull-up transistor of the first stack, which nanostructure includes a channel portion of the pull-up transistor, and end portion of a nanostructure of the pull-down transistor of the first stack, which nanostructure includes a channel portion of the pull-down transistor.

A cross-coupling between the source/drains of the pull-up and pull-down transistor of one stack and the common gate of the pull-up and pull-down transistor of the other stack may hence be achieved without a separate metal interconnect. A cell dimension may thereby be further reduced.

The common gate electrode of the pull-up and pull-down transistors of the first stack may be arranged to at least partially enclose, surround or wrap-around the end portion of the nanostructure channels of the pull-up and pull-down transistors of the second stack. Correspondingly, the common gate electrode of the pull-up and pull-down transistors of the second stack may be arranged to at least partially enclose, surround or wrap-around the end portion of the nanostructure channels of the pull-up and pull-down transistors of the first stack. A low-resistance cross-coupling may hence be achieved.

The bit cell may further comprise a first set of contacts arranged along a first cell boundary of the bit cell, at different vertical levels above the substrate, and a second set of contacts arranged along a second cell boundary of the bit cell, at different vertical levels above the substrate, the first and the second boundaries being mutually opposite boundaries of the bit cell, and each set of contacts including a pull-up voltage contact connected to the pull-up transistor of the first or second stack, a pull-down voltage contact connected to the pull-down transistor of the first or second stack and a bit line contact connected to the pass transistor of the first or second stack. This may facilitate connecting the bit cell with power rails (e.g. VDD and VSS supply voltages) and bit lines (e.g. BL and BLB) since the contacts are disposed along opposite boundaries of the bit cell.

By a boundary of a bit cell is hereby meant a side of a geometrical/imaginary rectangle (oriented parallel to the main surface/plane of extension of the substrate) within which a single bit cell (i.e. only the bit cell and no other bit cell) is confined. The first and second cell boundaries may accordingly correspond to a pair of mutually opposite sides of the geometrical rectangle.

A lower-most contact of the first set of contacts may present a longitudinal dimension which is greater than a longitudinal dimension of contacts of the first set of contacts arranged above the lower-most contact. This facilitates connecting the contacts with power rails and bit lines since above-lying contacts will not cover lower-lying contacts. The pull-up voltage contact and the pull-down voltage contact may be elongated in opposite directions. The second set of contacts may be correspondingly arranged.

The first set of contacts and the afore-mentioned common first source/drain contact may be connected to the transistors of the first stack on opposite sides of the common gate electrode of the pull-up and pull-down transistors of the first stack (and also on opposite sides of the gate electrode of the pass transistor of the first stack), as viewed along a channel direction of the transistors of the first stack. The second set of contacts and the common second source/drain contact may be connected to the transistors of the second stack on opposite sides of the common gate electrode of the second stack (and also on opposite sides of the gate electrode of the pass transistor of the second stack), as viewed along a channel direction of the transistors of the second stack. The common (first/second) source/drain contacts (with which no direct contact to power rails, word lines or bit lines need be made) may hence be disposed at a more central region of the bit cell while the contacts for power rails and bit lines may be disposed along the bit cell boundaries. This may facilitate integration of the bit cell in a memory array of an SRAM.

According to a second aspect of the disclosed technology there is provided a memory device including an array of bit cells, in accordance with the first aspect set out above, or any of the embodiments or variations thereof set out above. The memory device may be a SRAM.

The memory device may further comprise a set of contacts arranged to extend along and overlap a cell boundary between a first bit cell of the array and an adjacent second bit cell of the array, the contacts of the set being arranged at different vertical levels above the substrate and including: a pull-up voltage contact being shared by a pull-up transistor of a transistor stack of the first bit cell and a pull-up transistor of a transistor stack of the second bit cell, a pull-down voltage contact being shared by a pull-down transistor of the transistor stack of the first bit cell and a pull-down transistor of the transistor stack of the second bit cell, and a bit line contact being shared by a pass transistor of the transistor stack of the first bit cell and a pass transistor of the transistor stack of the second bit cell.

This arrangement of the set of contacts enables reduction of the cell widths since contacts may be shared between adjacent bit cells.

The first and the second bit cell may be arranged in a same column or row of the array.

The set of contacts may correspond to any one of the afore-mentioned first and second set of contacts.

The cell boundary may correspond to any one of the afore-mentioned first and second cell boundaries.

Each of the first bit cell and the second bit cell may be arranged in accordance with the above-mentioned bit cell, or the embodiments and variations thereof.

The transistor stack of the first bit cell may accordingly correspond to the afore-mentioned first or second vertical stack of transistors. The transistor stack of the second bit cell may correspond to the afore-mentioned second or first vertical stack of transistors.

The memory device may further comprise a set of contacts arranged to extend along a cell boundary between a first bit cell of the array and an adjacent second bit cell of the array, the contacts of the set being arranged at different vertical levels above the substrate and including: a pull-up voltage contact and a pull-down voltage contact. A lower-most one of the contacts may be elongated to extend interrupted between at least two adjacent bit cells, preferably a plurality of adjacent bit cells.

An upper one of the contacts may present a longitudinal dimension which is smaller than a longitudinal dimension of the lower-most contact. The upper contact may be elongated to extend between only, i.e. not more than, two adjacent bit cells.

The set of contacts may further include a bit line contact arranged above the pull-down and pull-up voltage contacts. A longitudinal dimension of the bit line contact may be smaller than a longitudinal dimension of the pull-up voltage contact and a longitudinal dimension of the pull-down voltage contact. The bit line contact may thereby not block access to the pull-up voltage contact and the pull-down voltage contact.

The memory device may further comprise a first, a second and a third horizontally extending nanostructure, extending across a cell boundary between a first bit cell of the array and an adjacent second bit cell of the array, wherein a channel portion of a pull-up transistor of a transistor stack of the first bit cell and a nanostructure channel of a pull-up transistor of a transistor stack of the second bit cell are formed in the first horizontally extending nanostructure, a channel portion of a pull-down transistor of the transistor stack of the first bit cell and a channel portion of a pull-down transistor of the transistor stack of the second bit cell are formed in the second horizontally extending nanostructure, and a channel portion of a pass transistor of the transistor stack of the first bit cell and a channel portion of a pass transistor of the transistor stack of the second bit cell are formed in the third horizontally extending nanostructure.

By forming the channel portions of the transistors of the transistor stacks in nanostructures shared between adjacent bit cells, a rational manufacture of a memory device is enabled.

The first and the second bit cell may be arranged in a same column or row of the array.

The cell boundary may correspond to any one of the afore-mentioned first and second cell boundaries.

Each of the first bit cell and the second bit cell may be arranged in accordance with the above-mentioned bit cell, or the embodiments and variations thereof.

The transistor stack of the first bit cell may accordingly correspond to the afore-mentioned first or second vertical stack of transistors. The transistor stack of the second bit cell may correspond to the afore-mentioned second or first vertical stack of transistors.

BRIEF DESCRIPTION OF THE DRAWINGS

The above, as well as additional objects, features and advantages of the disclosed technology, will be better understood through the following illustrative and non-limiting detailed description of preferred embodiments of the disclosed technology, with reference to the appended drawings. In the drawings like reference numerals will be used for like elements unless stated otherwise.

DETAILED DESCRIPTION OF CERTAIN ILLUSTRATIVE EMBODIMENTS

Figure 1:
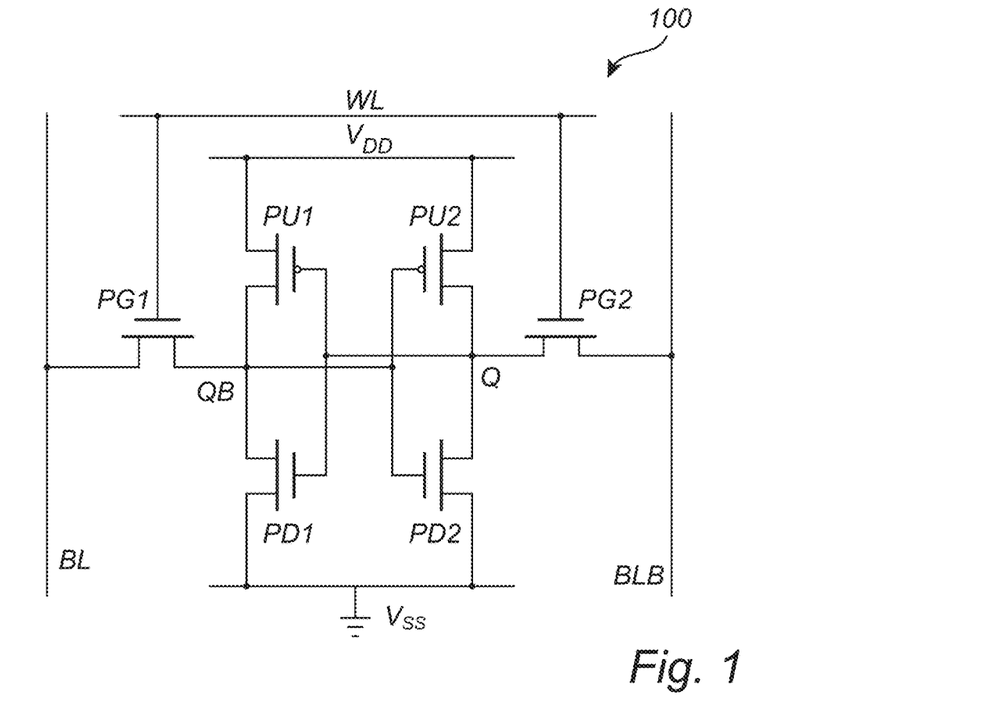
FIG. 1 is a circuit diagram of a static random access memory bit cell, according to embodiments.

FIG. 1 illustrates a circuit layout of a memory cell or bit cell 100 for an SRAM. The bit cell 100 shown in FIG. 1 is a 6 transistor bit cell and may accordingly be referred to as a 6T bit cell. The bit cell 100 includes first pull-up and first pull-down transistors PU1 and PD1, second pull-up and second pull-down transistors PU2 and PD2, and first and second pass transistors PG1, PG2. The pull-up transistor PU1 and the pull-down transistor PD1 are connected to form a first inverter. The pull-up transistor PU2 and the pull-down transistor PD2 are connected to form a second inverter. The first and the second inverters are furthermore cross-coupled to each other and hence form a cross-coupled inverter pair.

The pull-down transistors PD1, PD2 and the pass transistors PG1, PG2 may each be formed by an n-type FET, for instance an n-type metal-oxide-semiconductor FET (MOSFET) (which term here is considered to include also metal-insulator-semiconductor FETs, or MISFETs). The pull-up transistors PU1, PU2 may each be formed by a p-type FET, for instance a p-type MOSFET.

One of the source or the drain of the pull-up transistor PU1 and one of the source or the drain of the pull-down transistor PD1 are connected to a VDD and a VSS power rail, respectively. The other of the source or the drain of the pull-up transistor PU1 and the other of the source or the drain of the pull-down transistor PD1 are electrically interconnected to each other. The gates of the pull-up transistor PU1 and the pull-down transistor PD1 are electrically interconnected to each other. The pull-up transistor PU2 and the pull-down transistor PD2 are connected in a corresponding manner.

One of the source/drains of the pass transistor PG1 is electrically connected to the bit line BL and the other of the source/drains of the PG1 is electrically connected to the interconnected source/drains of the pull-up transistor PU1 and the pull-down transistor PD1. The gate of the pass transistor PG1 is connected to the word line WL. One of the source/drains of the pass transistor PG2 is electrically connected to the bit line BLB (which is complementary to the bit line BL) and the other of the source/drains of the PG2 is electrically connected to the interconnected source/drains of the pull-up transistor PU2 and the pull-down transistor PD2. The gate of the pass transistor PG2 is connected to the word line WL.

During operation, a voltage or charge may accordingly be stored at the points denoted Q and QB. The level of the stored charge or voltage may be sensed, accessed or read by switching the pass transistors PG1, PG2 on and sensing the resulting charge or voltage of the bit lines BL, BLB. A first and a second charge or voltage level may be associated and interpreted as a logical "1" or "0", i.e. as a bit of data.

Although not shown in FIG. 1, an SRAM may include an array of such bit cells. An SRAM may further include driver circuitry for controlling reading and writing to the bit cells, pre-charging the bit lines, etc. An SRAM may further include sense amplifiers for sensing and amplifying signals on the bit lines during reading operation. Implementing such circuitries and operations in an SRAM that are known in the art will not be further described herein.

Figure 2A:
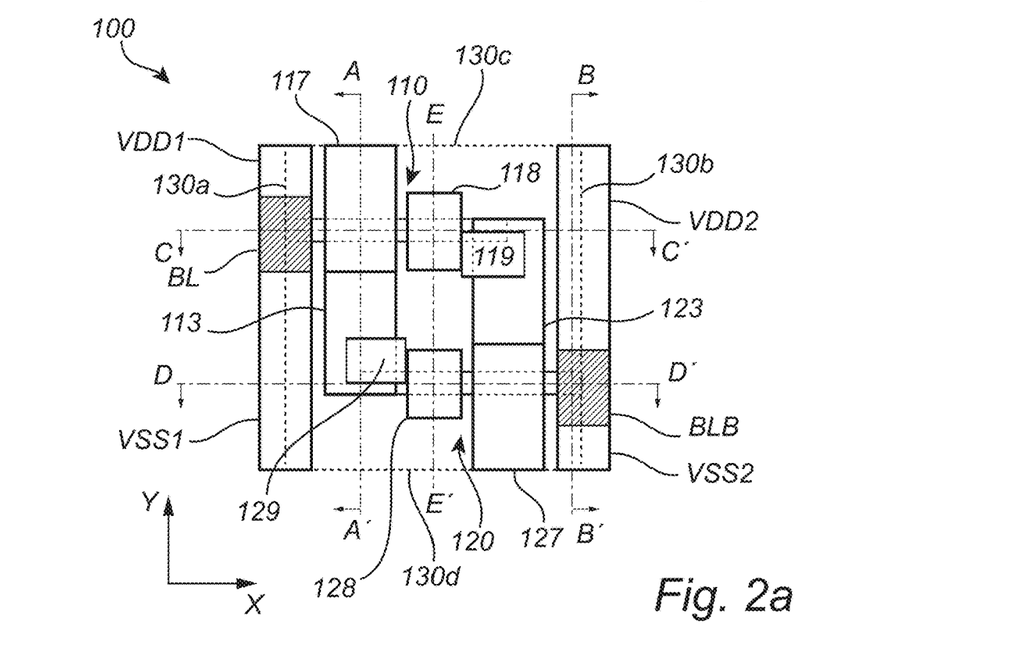
FIG. 2a is a schematic plan-view of a bit cell, according to embodiments.

FIG. 2a is a schematic top-down view of a bit cell 100 according to embodiments. FIGS. 2b-2e are sectional views of the bit cell 100 taken along the sectional planes AA', BB', CC', DD' respectively. It should also be noted that, for the purpose of illustrational clarity, various features of the illustrated bit cell 100 may not be drawn to scale and their relative dimensions may differ from a physical implementation.

The bit cell 100 includes a first vertical stack of transistors, hereinafter the first stack 110, and a second vertical stack of transistors, hereinafter the second stack 120, arranged on a substrate 102. For illustrative purposes, FIGS. 2a-2e schematically show the portion of the substrate 102 on which the bit cell 100 is arranged. It will be appreciated, however, that the substrate 102 may accordingly extend laterally/horizontally beyond the illustrated portions. The substrate 102 may, for instance, be a (bulk) silicon substrate, a silicon-on-insulator (SOI) substrate, a germanium-on-insulator (GeOI) substrate or a dielectric substrate. Other semiconductors than silicon or germanium is however also possible, for instance InGaAs, $MoS_2$ $WSe_2$, other 2D materials or graphene-including substrates, etc., to name a few.

The first stack 110 includes a pull-up transistor PU1, a pull-down transistor PD1 and a pass transistor PG1. The second stack 120 includes a pull-up transistor PU2, a pull-down transistor PD2 and a pass transistor PG2.

As described herein and throughout the specification, a nanostructure according to various embodiments has at least one dimension that is less than about 100 nm, less than about 50 nm, less than about 20 nm, less than about 10 nm, less than about 5 nm, or has a value in a range defined by any two of these values. A nanostructure can include a nanosheets or a nanowire according to embodiments. A nanosheets has at least a thickness having one of the values described herein, and a nanowire has at least a width or a diameter having one of the values described herein. Furthermore, a nanostructure can have an aspect ratio between the at least one dimension and another dimension that is less than 1, less than 0.5, less than 0.2, less than 0.1, less than 0.05, or less than 0.02, or a value in a range defined by any two of these values. For example, a nanowire can have a width to length ratio or a diameter to length ratio having one of the values described herein, and a nanosheet can have a thickness to length ratio or a thickness to width ratio or a diameter to length ratio having one of the values described herein.

Furthermore, a nanostructure according to various embodiments can have any shape, including any polygonal shape such as a rectangular or a cylindrical shape.

The pull-up transistor PU1 includes a horizontally extending nanostructure 112. The nanostructure 112 includes first and second source/drain (regions/portions) 112a, 112b respectively arranged on opposite sides of a channel (region/portion) 112c. The pull-down transistor PD1 includes a horizontally extending nanostructure 114. The nanostructure 114 includes first and second source/drain (regions/portions) 114a, 114b respectively arranged on opposite sides of a channel (region/portion) 114c. The bit cell 100 includes a gate electrode 113 which forms a common gate electrode for both the pull-up transistor PU1 and the pull-down transistor PD1. The gate electrode 113 at least partially encloses, surrounds or wraps around the channels 112c, 114c, at least along a longitudinal portion thereof.

The pass transistor PG1 includes a horizontally extending nanostructure 116. The nanostructure 116 includes first and second source/drain (regions/portions) 116a, 116b respectively arranged on opposite sides of a channel (region/portion) 116c. The bit cell 100 includes a gate electrode 117 which forms a gate electrode for the pass transistor PG1. The gate electrode 117 at least partially encloses, surrounds or wraps around the channel 116c at least along a longitudinal portion thereof. The gate electrode 113 and the gate electrode 117 form separate gate electrodes.

In the illustrated embodiment, one or more of the PD1, the PU1 and the PG1 comprise a gate all-around transistor (GAA) comprising a channel that is surrounded by a gate. However, embodiments are no so limited, and in other embodiments, one or more of the PD1, the PU1 and the PG1 comprise a tri-gate transistor or a dual-gate transistor, in which the channel is contacted on two and three sides thereof by the gate electrode, respectively. For example, the one or more of the PD1, the PU1 and the PG1 may be a FinFET transistor.

The pull-up transistor PU2 includes a horizontally extending nanostructure 122. The nanostructure 122 includes first and second source/drain (regions/portions) 122a, 122b respectively arranged on opposite sides of a channel (region/portion) 122c. The pull-down transistor PD2 includes a horizontally extending nanostructure 124. The nanostructure 124 includes first and second source/drain (regions/portions) 124a, 124b respectively arranged on opposite sides of a channel (region/portion) 124c. The bit cell 100 includes a gate electrode 123 which forms a common gate electrode for both the pull-up transistor PU2 and the pull-down transistor PD2. The gate electrode 123 at least partially encloses, surrounds or wraps-around the channels 122c, 124c at least along a longitudinal portion thereof.

The pass transistor PG2 includes a horizontally extending nanostructure 126. The nanostructure 126 includes first and second source/drain (regions/portions) 126a, 126b respectively arranged on opposite sides of a channel (region/portion) 126c. The bit cell 100 includes a gate electrode 127 which forms a gate electrode for the pass transistor PG2. The gate electrode 127 at least partially encloses, surrounds or wraps around the channel 126c at least along a longitudinal portion thereof. The gate electrode 123 and the gate electrode 127 form separate gate electrodes.

In the illustrated embodiment, one or more of the PD1, the PU1 and the PG1 comprise a gate all-around transistor (GAA) comprising a channel that is surrounded by a gate. However, embodiments are no so limited, and in other embodiments, one or more of the PD1, the PU1 and the PG1 comprise a tri-gate transistor or a dual-gate transistor, in which the channel is contacted on two and three sides thereof by the gate electrode, respectively. For example, the one or more of the PD1, the PU1 and the PG1 may be a FinFET transistor.

As will be further described in the following, the first source/drain 112a of the pull-up transistor PU1, the first source/drain 114a of the pull-down transistor PD1, the first source/drain 116a of the pass transistor PG1 and the gate electrode 123 are electrically interconnected. Correspondingly, the first source/drain 122a of the pull-up transistor PU2, the first source/drain 124a of the pull-down transistor PD2, the first source/drain 126a of the pass transistor PG2 and the gate electrode 113 are electrically interconnected.

Figure 2B:
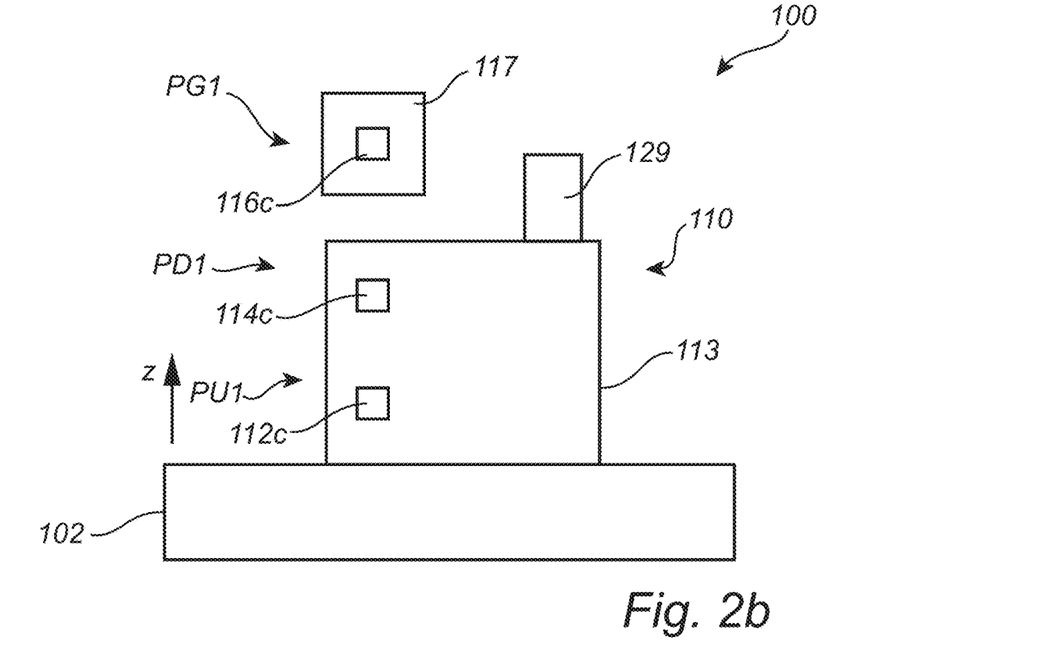
FIGS. 2b-2e are schematic cross-sectional views of the bit cell illustrated in FIG. 2a, of cross-sections taken at different vertical levels.
Figure 2C:
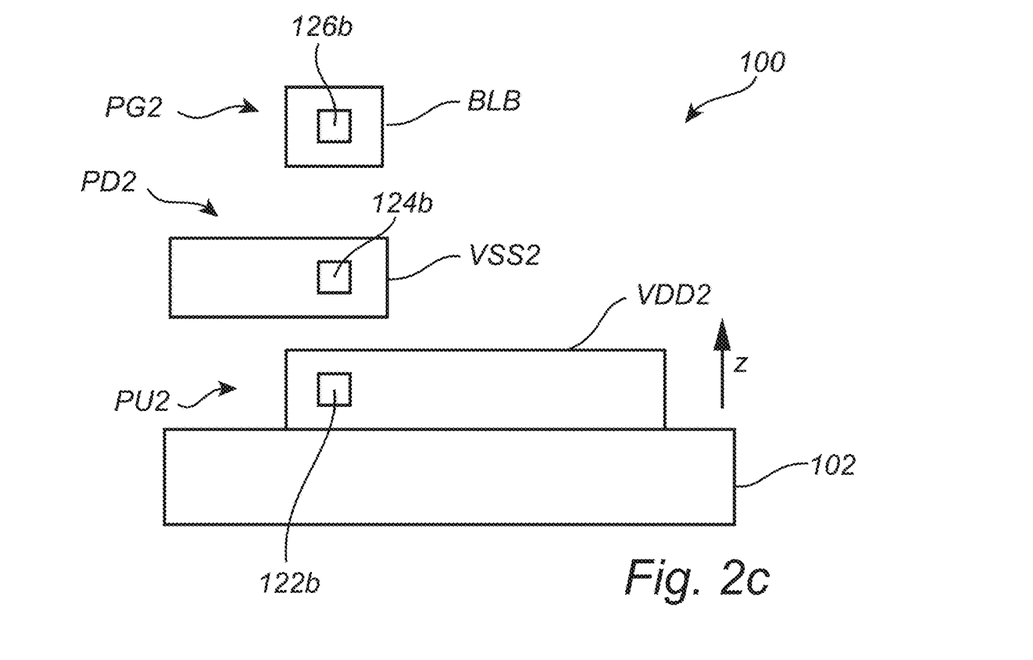
Figure 2D:
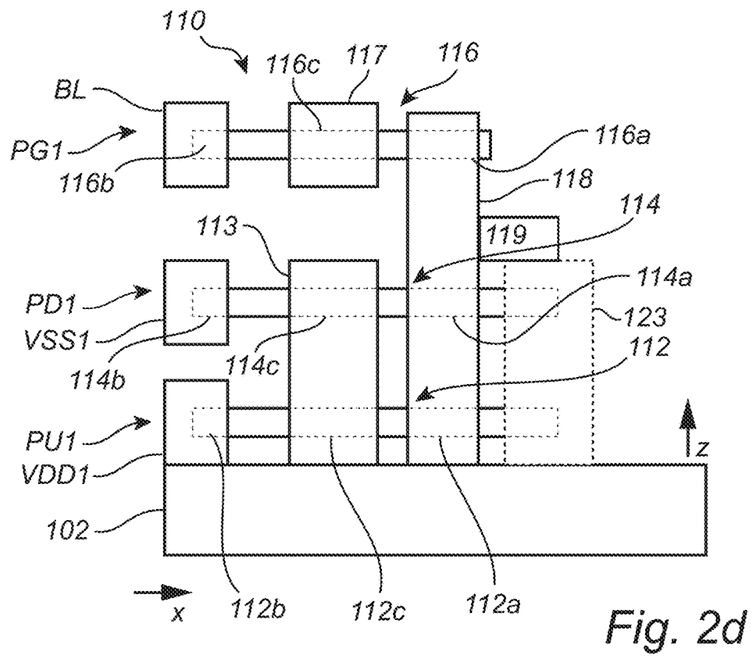
Figure 2E:
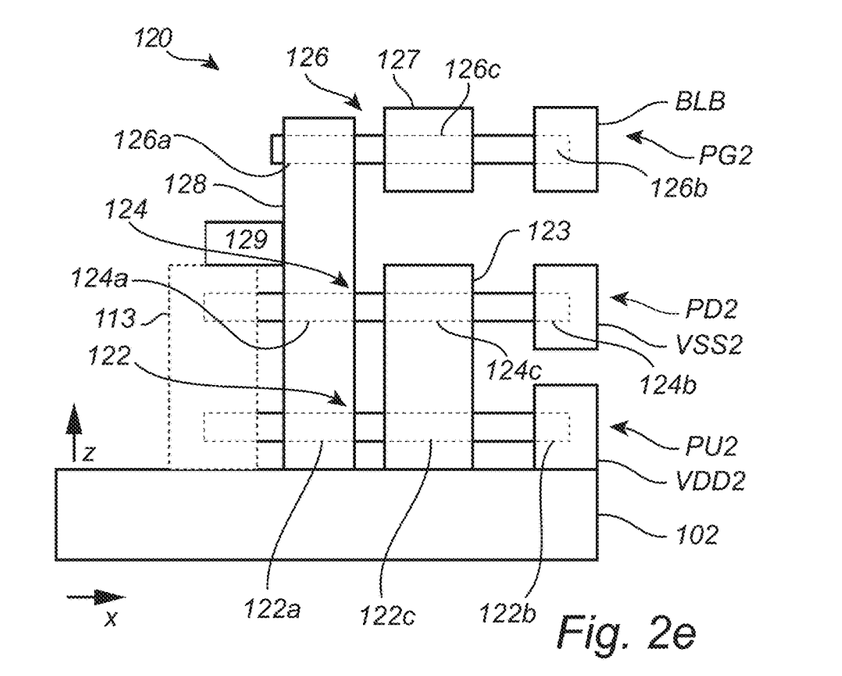

As indicated in FIGS. 2d and 2e, the nanostructure 112 and the channel 112c of the pull-up transistor PU1 is arranged at a same level or height above the substrate 102 as the nanostructure 122 and the channel 122c of the pull-up transistor PU2. The nanostructure 114 and the channel 114c of the pull-down transistor PD1 is arranged at a same level or height above the substrate 102 as the nanostructure 124 and the channel 124c of the pull-down transistor PD2. The nanostructure 116 and the channel 116c of the pass transistor PG1 is arranged at a same level or height above the substrate 102 as the nanostructure 126 and the channel 126c of the pass transistor PG2.

Accordingly, the pull-up transistors PU1 and PU2 may be arranged at a same level. The pull-down transistors PD1 and PD2 may be arranged at a same level. The pass transistors PG1 and PG2 may be arranged at a same level.

Each of the nanostructures 112, 114, 116 and the channels 112c, 114c, 116c of the transistors of the first stack 110 extend in parallel to a first horizontal direction (indicated by X in the figures). The direction X represents a channel direction of the transistors of the first stack 110, i.e. the direction along (i.e. in parallel to or anti-parallel to) which the charge carriers will flow in use of the bit cell 100. Correspondingly, each of nanostructures 122, 124, 126 and the channels 122c, 124c, 126c of the transistors of the second stack 120 extend in parallel to the direction X. In the figures is also indicated a second horizontal direction (indicated by Y), perpendicular to the direction X.

As may be seen in FIGS. 2a and 2b, the nanostructures 112, 114, 116 and the nanostructure channels 112c, 114c, 116c of the transistors of the first stack 110 are arranged in a common first geometrical plane defined by CC', which is parallel to a vertical or normal direction of the substrate 102 (indicated by Z in the figures) and the direction X. Also, the nanostructures 122, 124, 126 and the channels 122c, 124c, 126c of the transistors of the second stack 120 are arranged in a common second geometrical plane defined by DD', which is parallel to the normal direction Z and the direction X. The common first and second planes are moreover parallel to each other.

As may be seen in FIGS. 2d and 2e a vertical distance between the nanostructures 114 and 116 is greater than a vertical distance between the nanostructures 112 and 114. This applies correspondingly to the nanostructures 122, 124, 126.

As indicated in FIG. 2a, the channels 112c, 114c, 116c of the transistors of the first stack 110 are displaced with respect to the channels 122c, 124c, 126c of the second stack 120 in the second horizontal direction Y. It other words, the first and second geometrical planes are displaced relative to each other, in the second direction Y.

By way of example, a superlattice structure of a first semiconductor material layer and a second material layer may be epitaxially grown on the substrate 102. The superlattice structure may include alternating layers of SiGe and Si. The layers may be in-situ doped by an n-type or p-type dopant, in accordance with the type of transistor that is to be formed at each level. Superlattice fins may be formed by patterning and etching the superlattice structure. Horizontally extending Si nanostructures 112, 114, 116, suspended between remaining fin portions on opposite sides of the nanostructures 112, 114, 116, may thereafter be formed by selectively etching of e.g. the SiGe layers. A semiconductor layer (e.g. a SiGe layer) separating the semiconductor layers (e.g. Si layers) in which the nanostructures 114 and 116 are to be formed may be formed with a thickness greater than a semiconductor layer (e.g. a SiGe layer) separating the semiconductor layers (e.g. Si layers) in which the nanostructures 112 and 114 are to be formed. Thereby the nanostructures 114 and 116 may be formed to be further spaced apart than the nanostructures 112 and 114. After one or more supporting structures have been formed about the nanostructures 112, 114, 116 (for instance a dummy gate structure or a final gate structure), the remaining portions of the fins on the opposite sides of the nanostructures 112, 114, 116 may be removed by etching. The nanostructures 122, 124, 126 may be formed in a corresponding manner by selective etching of an adjacent fin.

The bit cell 100 further comprises a first source/drain contact 118 (which for brevity in the following may be referred to as the contact 118). The contact 118 is connected to the source/drain 112a, 114a, 116a of the pull-up transistor PU1, the pull-down transistor PD1 and the pass transistor PG1. The contact 118 thus forms a common first source/drain contact for the pull-up transistor PU1, the pull-down transistor PD1 and the pass transistor PG1. The contact 118 electrically interconnects the source/drain 112a, 114a, 116a of the transistors of the first stack 110.

The bit cell 100 further comprises a second source/drain contact 128 (which for brevity in the following may be referred to as the contact 128). The contact 128 is connected to the source/drain 122a, 124a, 126a of the pull-up transistor PU2, the pull-down transistor PD2 and the pass transistor PG2. The contact 128 thus forms a common second source/drain contact for the pull-up transistor PU2, the pull-down transistor PD2 and the pass transistor PG2. The contact 128 electrically interconnects the source/drain 122a, 124a, 126a of the transistors of the second stack 120.

The contacts 118, 128 are arranged on the substrate 102. The contacts 118, 128 may be separated from the substrate 102 by a dielectric (not shown). The contacts 118, 128 may hence be isolated from the substrate 102. The contacts 118, 128 may also be arranged directly on a respective dielectric portion of the substrate 102, for instance a dielectric layer such or an oxide formed on the substrate 102, a buried oxide (BOX) portion or a shallow trench isolation (STI) portion.

The contact 118 may as shown be arranged adjacent to the first stack 110. The contact 118 may extend vertically (along direction Z) from the substrate 102, at least up to the vertical levels or the height of the source/drains 112a, 114a, 116a of the transistors of the first stack 110. The first common geometrical plane extends through the contact 118. The contact 128 may as shown be arranged adjacent to the second stack 120. The contact 128 may extend vertically (along direction Z) from the substrate 102, at least up to the vertical levels or the heights of the source/drains 122a, 124a, 126a of the transistors of the second stack 120. The second common geometrical plane extends through the contact 128.

The contacts 118 and 128 are arranged between the common gates 113 and 123, as viewed along the direction X. As shown in FIG. 2a the contacts 118 and 128 may be arranged on a same geometrical line E-E' extending in parallel to the direction Y.

As indicated in the figures the contact 118 may at least partially enclose, surround or wrap-around at least a portion of the source/drains 112a, 114a, 116a. The nanostructures 112, 114, 116 may hence extend into the contact 118. The contact 128 may at least partially enclose, surround or wrap-around at least a portion of the source/drains 122a, 124a, 126a. The nanostructures 122, 124, 126 may hence extend into the contact 128. In an alternative contact design, the source/drain contact 118 may be arranged to make physical contact with the source/drains 112a, 114a, 116a without completely wrapping-around the source/drains. The common first source/drain contact may for instance abut on only a respective sidewall surface of the source/drains 112a, 114a, 116a, or an end face thereof. This may apply correspondingly to the source/drain contact 128 and the source/drains 122a, 124a, 126a.

The contacts 118, 128 may be formed by one or metals. The contacts 118, 128 may also be formed by a doped semiconductor material. A metal contact 118, 128 may for instance be formed by, subsequent to forming the horizontally extending nanostructures 112, 114, 116 and 122, 124, 126 open a respective trench in a dielectric covering the nanostructures to expose the first source/drains 112a, 114a, 116a and 122a, 124a, 126a. The trench may be filled with one or more metals, deposited for instance by atomic layer deposition. A semiconductor contact 118 or 128 may for instance be formed by epitaxially growing a doped semiconductor material on the source/drains 112a, 114a, 116a or 122a, 124a, 126a until the growth surfaces join to form a common contact 118 or 128.

The bit cell 100 further comprises a pull-up voltage contact VDD1, a pull-down voltage contact VSS1 and a bit line contact BL, forming part of a first set of contacts. The bit cell 100 further comprises a pull-up voltage contact VDD2, a pull-down voltage contact VSS2 and a bit line contact BLB, forming part of a second set of contacts.

FIG. 2a indicates in dashed lines a rectangular cell area delimited by a rectangular boundary or perimeter including first, second, third and fourth cell boundaries 130a, 130b, 130c, 130d. The first and the second boundaries 130a, 130b form mutually opposite sides of the rectangular boundary. The first and the second boundaries 130a, 130b are parallel to the second direction Y. The third and the fourth boundaries 130c, 130d form mutually opposite sides of the rectangular boundary. The third and the fourth boundaries 130c, 130d are parallel to the first direction X.

The first set of contacts is arranged along the first cell boundary 130a. The contacts VDD1, VSS1 and BL are arranged at different vertical levels above the substrate 102. The contacts VDD1, VSS1 and BL are arranged above each other, stacked along the direction Z. The afore-mentioned common first geometrical plane extends through the contacts VDD1, VSS1 and BL. The second set of contacts is arranged along the second cell boundary 130b. The contacts VDD2, VSS2 and BLB are arranged at different vertical levels above the substrate 102. The contacts VDD2, VSS2 and BLB are arranged above each other, stacked along the direction Z. The afore-mentioned common second geometrical plane extends through the contacts VDD2, VSS2 and BLB.

The lower-most contact VDD1 presents a longitudinal dimension which is greater than a longitudinal dimension of the contacts of the above contacts VSS1 and BL. The lower-most contact VDD2 presents a longitudinal dimension which is greater than a longitudinal dimension of the contacts of the above contacts VSS2 and BLB. The longitudinal dimensions here refers to the extension along direction Y.

The first set of contacts and the second set of contacts may as shown be arranged in respective peripheral regions of the bit cell 100. The contacts 118 and 128 may be arranged in a region of the bit cell 100 laterally or horizontally inside of the peripheral regions, in an approximately central region of the bit cell 100. The first set of contacts and the contact 118 are connected to the transistors of the first stack 110 on opposite sides of the gate electrodes 113 and 117, as viewed along the direction X. The second set of contacts and the contact 128 are connected to the transistors of the second stack 120 on opposite sides of the gate electrodes 123 and 127, as viewed along the direction X.

The pull-up voltage contact VDD1 may be connected to the second source/drain 112b of the pull-up transistor PU1. The pull-down voltage contact VSS1 may be connected to the second source/drain 114b of the pull-down transistor PD1. The bit line contact BL may be connected to the second source/drain 116b of the pass transistor PG1. The pull-up voltage contact VDD2 may be connected to the second source/drain 122b of the pull-up transistor PU2. The pull-down voltage contact VSS2 may be connected to the second source/drain 124b of the pull-down transistor PD2. The bit line contact BLB may be connected to the second source/drain 126b of the pass transistor PG2.

As indicated in the figures the contacts VDD1, VSS1, BL may enclose or wrap-around at least a portion of a respective source/drain 112b, 114b, 116b. The nanostructures 112, 114, 116 may hence extend into the respective contacts VDD1, VSS1, BL. The contacts VDD2, VSS2, BLB may at least partially enclose, surround or wrap-around at least a portion of a respective source/drain 122b, 124b, 126b. The nanostructures 122, 124, 126 may hence extend into the respective contacts VDD1, VSS1, BL. In an alternative contact design, the first set of contacts may be arranged to make physical contact with the respective source/drains 112b, 114b, 116b without completely wrapping-around the source/drains. The first set of contacts may for instance abut on only a respective sidewall surface of the source/drains 112b, 114b, 116b, or an end face thereof. This may apply correspondingly to the second set of contacts and the source/drains 122b, 124b, 126b.

The contacts of the first and the second set may each be formed by a same type material as discussed in connection with the contacts 118, 128. Doped semiconductor contacts may for instance be formed by epitaxially growing a doped semiconductor material on the source/drains 112b, 114b, 116b or 122b, 124b, 126b.

A first set of metal contacts VDD1, VSS1, BL may for instance be formed by, subsequent to forming the horizontally extending nanostructures 112, 114, 116 open a trench in a dielectric covering the nanostructures, the trench exposing the second source/drains 112b, 114b, 116b and having lateral dimensions corresponding to the desired lateral dimensions of the contact VDD1. The trench may be filled with one or more metals, deposited for instance by atomic layer deposition. The deposited metal may be etched back in the trench to once again expose the second source/drains 114b, 116b. VDD1 has thereby been formed. The trench may be filled with dielectric material. A further trench may be formed in the dielectric, the trench exposing the second source/drains 114b, 116b and having a lateral dimensions corresponding to the desired lateral dimensions of the contact VSS1. The trench may be filled with one or more metals, deposited for instance by atomic layer deposition. The deposited metal may be etched back in the trench to once again expose the second source/drain 116b. VSS1 has thereby been formed. The trench may be filled with dielectric material and the above steps may be repeated again for forming the contact BL. A second set of metal contacts VDD2, VSS2, BLB may be formed in a corresponding manner.

First and second sets of semiconductor contacts may for instance be formed by epitaxially growing a doped semiconductor material on the source/drains 112b, 114b, 116b or 122b, 124b, 126b to form enlarged doped contacts at the source/drains 112b, 114b, 116b or 122b, 124b, 126b. The final longitudinal dimensions of the first and second set of contacts may subsequently be achieved by growing doped semiconductor material in trenches in a dielectric, formed sequentially at the respective levels of the source/drains 112b, 114b, 116b or 122b, 124b, 126b, with lateral dimensions corresponding to the desired lateral dimensions of the respective contacts VDD1, VSS1, BL, VDD2, VSS2, BLB. Alternatively, metal may instead be deposited in the trenches to form metal/semiconductor contacts. The metal may be deposited in a similar manner as was described above for the first set of metal contacts.

As shown in FIG. 2d, the gate electrode 117 of the pass transistor PG1 is arranged above the common gate electrode 113 of the pull-up transistor PU1 and the pull-down transistor PD1. As shown in FIG. 2e, the gate electrode 127 of the pass transistor PG2 is arranged above the common gate electrode 123 of the pull-up transistor PU2 and the pull-down transistor PD2.

The gate electrode 117 may be separated by an insulator from the common gate electrode 113. Voltages may thus be applied independently to the gate electrode 117 and the gate electrode 113. The insulator between the gate electrodes 113 and 117 may be formed by a dielectric layer. The insulator may also be formed by an air gap. Correspondingly, the gate electrode 127 may be separated by an insulator from the of common gate electrode 123.

The common gate electrodes 113, 123 are arranged on the substrate 102. The gate electrodes 113, 123 may be separated from the substrate 102 by a dielectric (not shown). The gate electrodes 113, 123 may hence be isolated from the substrate 102. The gate electrodes 113, 123 may also be arranged directly on a respective dielectric portion of the substrate 102, for instance a dielectric layer such or an oxide formed on the substrate 102, a BOX portion or an STI portion.

The gate electrodes 113, 123, 117 and 127 are furthermore isolated from each other such that gate voltages may be applied to the gate electrodes independently from each other.

Each of the gate electrodes 113, 117, 123, 127 may include one or more metals, for instance Ti, Ta, W, T, Al (or alloys thereof). The gate electrode 113 may form part of a gate stack which is common to the pull-up transistor PU1 and the pull-down transistor PD1 and including, in addition to the gate electrode 113, a gate dielectric (not shown in the figures). Correspondingly, the gate electrode 123 may form part of a gate stack which is common to the pull-up transistor PU2 and the pull-down transistor PD2 and including, in addition to the gate electrode 113, a gate dielectric. A gate dielectric may include a low-k dielectric such as an oxide, for instance a SiO2, and/or a high-k dielectric, for instance $HfO_2$, $Al_2O_3$, $TiO_2$ or $ZrO_2$.

Gate formation may include for instance deposition of a dielectric layer above the nanostructures 112, 114, 116, 122, 124, 126. A trench may be etched in the dielectric layer, the trench exposing the respective channel portions 112c, 114c, 116c, 122c, 124c, 126c of the nanostructures 112, 114, 116, 122, 124, 126. Following deposition of a gate dielectric on and about the channel portions 112c, 114c, 116c, 122c, 124c, 126c, metal may be deposited in the trenches, for instance by atomic layer deposition, to wrap around the channel portions. The deposited metal may be etched back in the trenches to expose the channel portions 116c and 126c with the gate dielectric formed thereon. The gate electrodes 113, and 123 have thereby been formed. The trench may be filled with dielectric material. A further trench may be formed in the dielectric, the trench exposing the channel portions 116c and 126c. Metal may be deposited in the trenches to form the gate electrodes 117 and 127, electrically isolated from the gate electrodes 113, 123 by dielectric material.

As may be seen in FIGS. 2a and 2b, the common gate electrode 113 may extend to be elongated in the second horizontal direction Y to intersect the second geometrical plane DD', to at least partially coincide with/overlap the position of the contact 128 as viewed in the direction X. Correspondingly, the common gate electrode 123 may extend to be elongated in the second horizontal direction Y to intersect the first geometrical plane CC' to at least partially coincide with/overlap the position of the contact 118 as viewed in the direction X.

Although not shown in the figures, nanostructures 112, 114, 116, 122, 124, 126, the gate electrodes 113, 117, 123, 117, the contacts 118, 128 and the first and second set of contacts may be arranged in or covered by a dielectric material.

As schematically indicated in the figures, the bit cell 100 may comprise a first interconnect 119 interconnecting the contact 118 and the common gate electrode 123. The bit cell 100 may comprise a metal interconnect 129 interconnecting the contact 128 and the common gate electrode 113. A cross-coupling between the PU1/PD1 inverter and the PU2/PD2 inverter thereby results.

The first interconnect 119 may be arranged to abut, i.e. engage with, at least a sidewall of the contact 118 and at least a sidewall or an upper surface of the gate electrode 123. By the gate electrode 123 being elongated to overlap the contact 118 as described above a comparably short interconnection is possible. The second interconnect 129 may correspondingly be arranged to abut at least a sidewall of the contact 128 and at least a sidewall or an upper surface of the gate electrode 113.

The first and the second interconnects 119, 129 may be formed by a respective metal (for instance of a same type as that of the gate electrodes 113, 123). A trench may be etched in the dielectric covering the bit cell 100, the trench exposing a portion of the contact 118 and of the gate electrode 123. A further trench may be etched in the dielectric covering the bit cell 100, the further trench exposing a portion of the contact 128 and of the gate electrode 113. Metal may thereafter be deposited in the trenches to form the first and the second metal interconnects 119, 129. The first and the second metal interconnects 119, 129 may also be integrally formed with the first/second source/drain contacts and/or the gate electrodes 113, 123 by simultaneously depositing metal for the contacts, gate electrodes and the interconnects.

Instead of interconnecting the contacts 118, 128 with the gate electrodes 123, 113, respectively, by interconnects as per the above, a cross-coupling between the PU1/PD1 inverter and the PU2/PD2 inverter may also be realized by interconnecting in metallization levels arranged above the bit cell 100 (for instance in a back-end-of-line portion above the substrate 102). For instance, the contact 118 may be interconnected with the gate electrode 123 by a metal track in a metallization level and a pair of vertical vias connecting the metal track to the contact 118 and the electrode 123. An interconnection between the gate electrode 113 and the contact 128 may be achieved in a corresponding manner.

As may be seen in FIGS. 2a, 2d and 2e the nanostructures 112, 114 may extend through the contact 118 and into the gate electrode 123. The gate electrode 123 may at least partially enclose, surround or wrap-around the end portions of the nanostructures 112, 114. The gate electrode 123 may be isolated from the portions of the nanostructures 112, 114 extending into the gate electrode 123, by a dielectric, for instance of a same material and formed at a same time as forming the above-mentioned gate dielectric. The nanostructures 122, 124 may extend through the contact 128 and into the gate electrode 113 in a corresponding manner.

Alternatively, if no dielectric is present on the end portions of the nanostructures 112, 114 the gate electrode 123 may be electrically connected to the end portions of the nanostructures 112, 114. Correspondingly, the gate electrode 113 may be electrically connected to the end portions of the nanostructures 122, 124. The inverters may thereby be cross-coupled without the metal interconnects 119, 129.

Figure 3A:
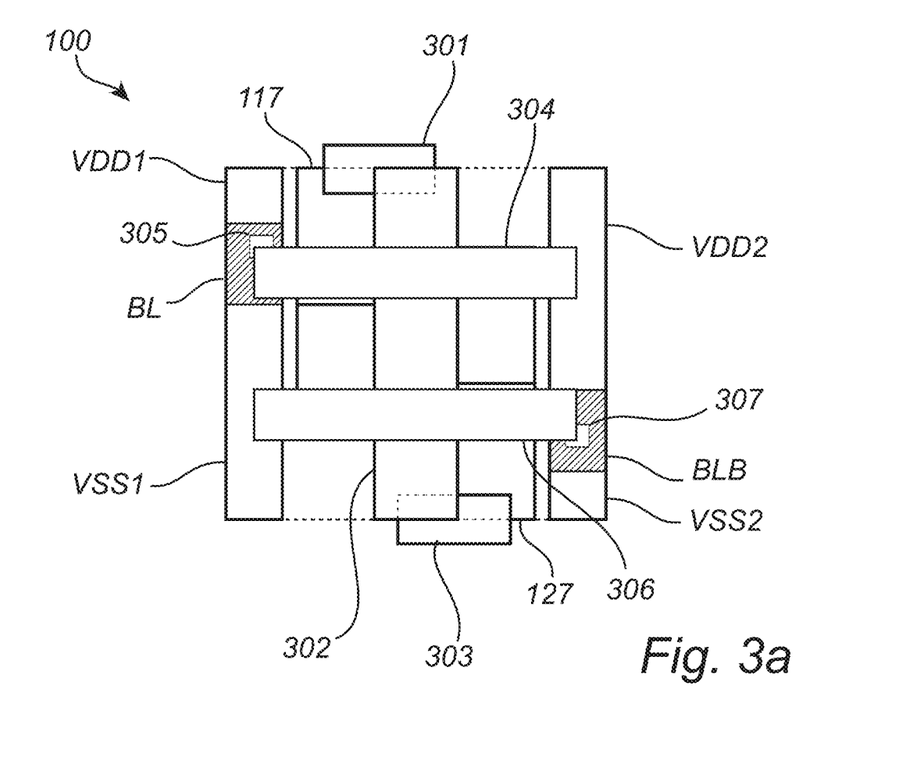
FIGS. 3a-3c are schematic cross-sectional views of a bit cell implemented in an array, according to embodiments.

FIG. 3a shows a single bit cell 100 forming part of an SRAM. The bit cell 100 is connected with a word line 302, a bit line 304 and a complementary bit line 306. The word line 302 and the bit lines 304, 306 may be formed by metal tracks in one or more metallization levels arranged above the bit cell 100, for instance in the back-end-of-line portion of the SRAM. The word line 302 may be arranged above or below the bit lines 304, 306. The word line 302 and the bit lines 304, 306 may be connected to the bit cell 100 by vias arranged in the metallization level(s) and extending through an interlayer dielectric arranged above the bit cell 100. Vias may be formed by a metal or another conductor such as a highly doped semiconductor material.

The word line 302 is connected to the gate electrode 117 of the pass transistor PG1. The word line 302 may be connected to the gate electrode 117 by an interconnect 301. The interconnect 301 as well as the further illustrated interconnects are shown in a highly schematic manner for illustrational clarity and are accordingly not depicted in a manner representing the dimensions and shape of a via in practice. The word line 302 is connected to the gate electrode 127 of the pass transistor PG2. The word line 302 may be connected to the gate electrode 127 by an interconnect 303. The bit line 304 is connected to the bit line contact BL. The bit line 304 may be connected to the bit line contact BL by an interconnect 305. The bit line 306 is connected to the bit line contact BLB. The bit line 306 may be connected to the bit line contact BLB by an interconnect 307.

Figure 3B:
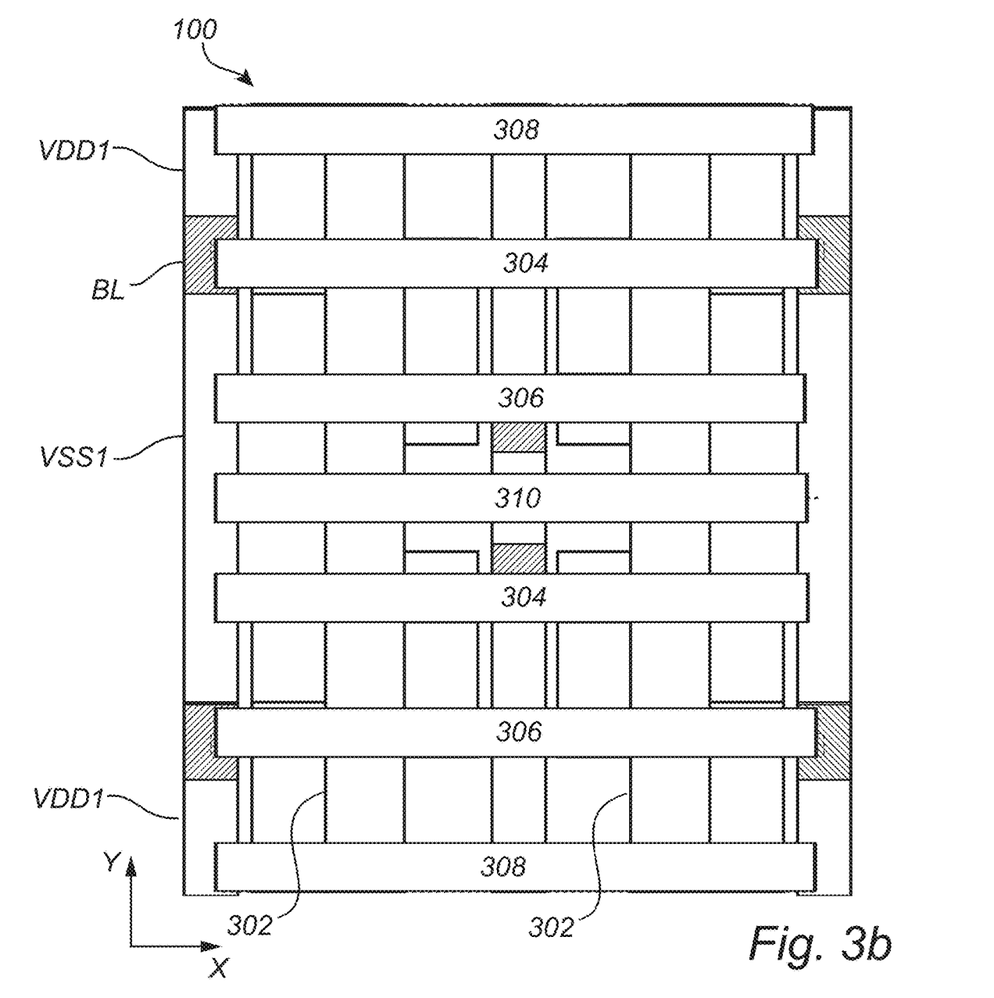

FIG. 3b shows bit cells forming part of a 2×2 SRAM array of equivalent bit cells. In practice, an SRAM may obviously include an array of a much greater number of bit cells. The indicated X and Y directions may refer to a column and row direction, respectively. In addition to FIG. 3a, FIG. 3b shows power rails VDD 308 and VSS 310. The power rails 308, 310 may similar to the bit lines 304, 306 and word lines 302 be formed by metal tracks in one or more metallization levels arranged above the bit cell 100. The power rails 308, 310 extend transverse to the word lines 302

The VDD power rails 308 may be connected to each VDD contact (e.g. VDD1 and VDD2 of the bit cell 100) by an interconnect. The VSS power rails 310 may be connected to each VSS contact (e.g. VSS1 and VSS2 of the bit cell 100) by an interconnect.

The VDD1 pull-up voltage contact may as shown extend interrupted between adjacent, consecutive, bit cells. The VDD1 pull-up voltage contact may accordingly be shared by two bit cells of a same column. The VDD1 pull-up voltage contact may even be shared by a plurality, or all, bit cells of a same column (in FIG. 3b bit cells aligned along direction Y). This applies correspondingly to the VDD2 pull-up voltage contact (not indicated in FIG. 3b). Meanwhile, the VSS1 pull-down voltage contact may as shown extend interrupted between a pair of adjacent bit cells. To facilitate access to the underlying VDD1 pull-up voltage contact, the VSS1 pull-down voltage contact should however advantageously not extend between more than two adjacent bit cells. This applies correspondingly to the VSS2 pull-down voltage contact (not indicated in FIG. 3b). Thereby it may be ensured that the VSS1 pull-down voltage contact does not prevent a via to be performed between the VDD power rails 308 and the VDD1 pull-up voltage contact.

Alternatively, both the pull-up voltage contacts VDD1, VDD2 and the pull-down voltage contacts VSS1, VSS2 may extend interrupted between the same number of plural (or all) adjacent bit cells of a same column. The power supply may then be connected to the pull-up voltage contacts VDD1, VDD2 and the pull-down voltage contacts VSS1, VSS2 at the periphery of the array.

The bit cells of the array are oriented in relation to each other such that VDD, VSS and BL contacts are shared by adjacent pairs of bit cells, more specifically by adjacent pairs of bit cells arranged in a same row of the array.

Figure 3C:
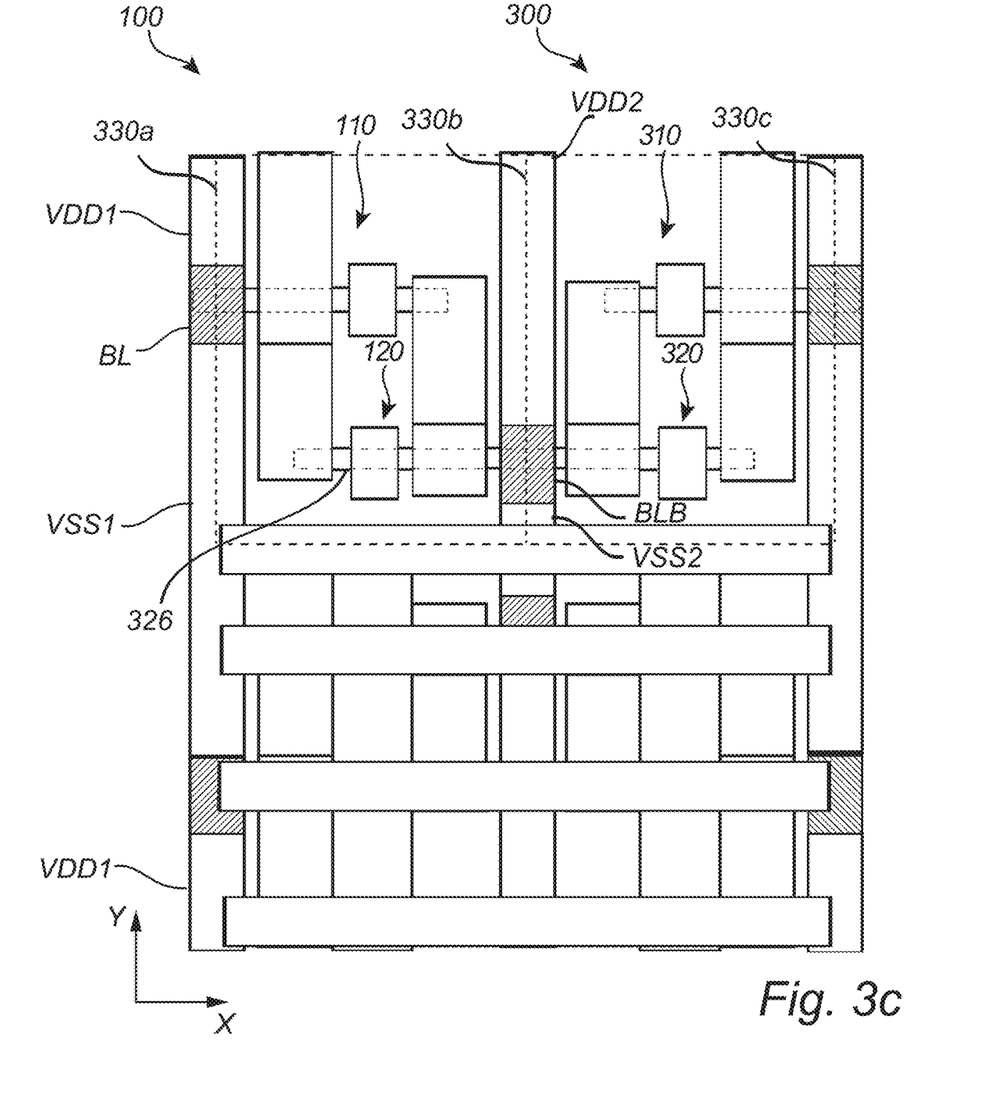

This may be more easily seen in FIG. 3c wherein the bit lines and word lines have been removed above the (first) bit cell 100 and a second bit cell 300 to expose the structure of the bit cells. The second bit cell 300 corresponds to the bit cell 100 but differs in that the structure of the bit cell 300 is mirrored in relation to the bit cell 100. The second bit cell 300 includes first and second vertical transistor stacks 310, 320 corresponding to stacks 120 and 110, respectively.

The set of contacts including contacts VDD2, VSS2 and BLB are arranged to extend along and overlap the cell boundary 330b (corresponding to the cell boundary 130b) between the first bit cell 100 and the adjacent second bit cell 300.

The pull-up voltage contact VDD2 is shared by the pull-up transistor PU2 of the transistor stack 120 of the first bit cell 100 and a pull-up transistor of the transistor stack 320 of the second bit cell 300. The pull-down voltage contact VDD2 is shared by the pull-down transistor PD2 of the transistor stack 120 and a pull-down transistor of the transistor stack 320. The bit line contact BLB is shared by the pass transistor PG2 of the transistor stack 120 and a pass transistor of the transistor stack 320.

Correspondingly the pull-up transistor PU1, the pull-down transistor PD1 and the pass transistor PG1 of the transistor stack 110 of the first bit cell 100 may be connected to a set of contacts including contacts VDD1, VSS1, BL arranged to extend along and overlap the cell boundary 330a (corresponding to the cell boundary 130a) between the first bit cell 300a and an adjacent (not shown) further bit cell arranged in a same row of the array as the bit cells 100 and 300. Correspondingly a pull-up transistor, a pull-down transistor and a pass transistor of the transistor stack 310 of the second bit cell 300 may be connected to a set of contacts including a pull-up voltage contact, a pull-down voltage contact and a bit line contact arranged to extend along and overlap the cell boundary 330c between the second bit cell 300 and an adjacent (not shown) further bit cell arranged in a same row of the array as the bit cells 100 and 300.

A nanostructure 326 of the first bit cell 100, corresponding to the nanostructure 126, may extend across the cell boundary 330b. A channel of the pass transistor of the transistor stack 120 of the first bit cell 100 and a channel of a pass transistor of the transistor stack 320 of the second bit cell 300 may be formed or arranged in the nanostructure 326. The nanostructure 326 may hence be shared between the adjacent bit cells 100, 300.

Correspondingly, a channel corresponding to the channel 124c and a channel corresponding to the channel 122c may be shared between the bit cells 100, 300. Accordingly, the channels of the pull-up transistors of the transistor stacks 120 and 320 may be formed in a shared nanostructure. Moreover, the channels of the pull-down transistors of the transistor stacks 120 and 320 may be formed in a shared nanostructure. In FIG. 3c, these nanostructures and channels are obscured by the top-most nanostructure 326 and are therefore not indicated.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For instance, in the above, a detailed description of implementations of a bit cell 100 including 6 transistors will be described. However, it is contemplated that the bit cell may include further transistors. For instance, a bit cell including 8 transistors (i.e. an 8T bit cell) to provide a bit cell with dedicated read- and write ports. The circuit layout and operation of such bit cells is per se known in the art and will therefore not be further described herein. The further transistors may be incorporated in the bit cell, adjacent to the first and second transistor stacks. The further transistors may also be included in the first and second transistor stacks. An additional pass transistor may be arranged in each one of the first stack 110 and the second stack. Each additional pass transistor may have a gate which is separated from the gates 113, 117, 123 and 127. A first source/drain of the additional pass transistor of the first stack 110 may be connected to the contact 118. A first source/drain of the additional pass transistor of the second stack 120 may be connected to the contact 128. Second source/drains of the additional pass transistors may be connected to separate source/drain contacts forming part of the first and second set of contacts, respectively.

Additionally, in figures the nanostructures 112, 114, 116, 122, 124, 126 are shown as generally elongate nanostructures with roughly rectangular cross sections, i.e. "nanowires". However, the nanostructures may also be formed with a cross sectional dimension being extended along e.g. the second horizontal direction Y compared to a cross sectional dimension in the vertical direction Z, i.e. "nanosheets".

Also, the transistors of the first and the second stacks may include more than a single nanostructure, for instance two, three or more nanostructures arranged in a common horizontally extending geometrical plane, each including a channel portion. Alternatively or additionally, two, three or more nanostructures may be arranged in a common vertically extending geometrical plane.

Moreover, in the figures the pull-up transistors PU1 and PU2 and the associated contacts are arranged below the pull-down transistors PD1 and PD2, respectively. An opposite order of these transistors is however also possible.

Furthermore, in the figures the pass transistors PG1 and PG2 are arranged as top-most transistors of the first and the second stacks 110, 120, respectively. It is however also possible to arrange the pass transistors PG1 and PG2 below the pull-up and pull-down transistors PU1, PD1 and PU2, PD2, respectively. In that case, the gate electrodes 117, 127 will accordingly be arranged below the common gate electrodes 113, 123.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A memory cell, comprising:
   a substrate having a major surface extending in a horizontal direction;
   a first stack of transistors and a second stack of transistors formed over the substrate, each of the first and second stacks of transistors including:
      a pull-up transistor, a pull-down transistor and a pass transistor that are vertically stacked in a vertical direction crossing the horizontal direction,
      wherein each of the transistors includes a channel extending substantially in the horizontal direction,
      wherein the pull-up transistor and the pull-down transistor have a common gate electrode extending in the vertical direction between the pull-up transistor and the pull-down transistor, and
      wherein the pass transistor has a gate electrode that is separate from the common gate electrode,
   wherein a source/drain of the pull-up transistor of the first stack, a source/drain of the pull-down transistor of the first stack, a source/drain of the pass transistor of the first stack and the common gate electrode of the second stack are electrically interconnected, and
   wherein a source/drain of the pull-up transistor of the second stack, a source/drain of the pull-down transistor of the second stack, a source/drain of the pass transistor of the second stack and the common gate electrode of the first stack are electrically interconnected.

2. The memory cell according to claim 1, further comprising:
   a common first source/drain contact connected to the source/drain of each of the pull-up transistor, the pull-down transistor and the pass transistor of the first stack; and
   a common second source/drain contact connected to the source/drain of each of the pull-up transistor, the pull-down transistor and the pass transistor of the second stack.

3. The memory cell according to claim 2, further comprising a first interconnect connecting the common first source/drain contact to the common gate electrode of the second stack, and a second interconnect connecting the common second source/drain contact to the common gate electrode of the first stack.

4. The memory cell according to claim 1,
   wherein the common gate electrode of the first stack is physically and electrically connected to: an end portion of a nanostructure including the channel of the pull-up transistor of the second stack, and to an end portion of a nanostructure including the channel of the pull-down transistor of the second stack, and
   wherein the common gate electrode of the second stack is physically and electrically connected to: an end portion of a nanostructure including the channel of the pull-up transistor of the first stack and to an end portion of a nanostructure including the channel of the pull-down transistor of the first stack.

5. The memory cell according to claim 1, wherein the gate electrode of the pass transistor of the first stack is separated by an insulator from the common gate electrode of the pull-up transistor and the pull-down transistor of the first stack, and wherein the gate electrode of the pass transistor of the second stack is separated by an insulator from the common gate electrode of the pull-up transistor and the pull-down transistor of the second stack.

6. The memory cell according to claim 1, wherein the pass transistor of the first stack is arranged above the pull-up transistor and the pull-down transistor of the first stack, and wherein the pass transistor of the second stack is arranged above the pull-up transistor and the pull-down transistor of the second stack.

7. The memory cell according to claim 1, wherein the gate electrode of the pass transistor of the first stack is arranged above the common gate electrode of the pull-up transistor and the pull-down transistor of the first stack, and wherein the gate electrode of the pass transistor of the second stack is arranged above the common gate electrode of the pull-up transistor and the pull-down transistor of the second stack.

8. The memory cell according claim 1, wherein the channels of the transistors of the first stack are arranged in a common first geometrical plane which is parallel to the vertical direction, and wherein the channels of the transistors of the second stack are arranged in a common second geometrical plane which is parallel to the vertical direction.

9. The memory cell according to claim 8, wherein the first and second geometrical planes are parallel to each other and displaced in relation to each other.

10. The memory cell according to claim 8, further comprising:
a common first source/drain contact connected to each of the source/drain of the pull-up transistor, the source/drain of the pull-down transistor and the source/drain of the pass transistor of the first stack; and
a common second source/drain contact connected to each of the source/drain of the pull-up transistor, the source/drain of the pull-down transistor and the source/drain of the pass transistor of the second stack,
wherein the common first source/drain contact and the common second source/drain contact are arranged between the common gate of the pull-up transistor and the pull-down transistor of the first stack and the common gate of the pull-up transistor and the pull-down transistor of the second stack, as viewed along a horizontal direction parallel to the first and second geometrical planes.

11. The memory cell according to claim 10, wherein the common gate electrode of the pull-up and pull-down transistors of the first stack extends to intersect the second geometrical plane, and wherein the common gate electrode of the pull-up and pull-down transistors of the second stack extends to intersect the first geometrical plane.

12. The memory cell according to claim 1, further comprising a first set of contacts arranged along a first cell boundary of a bit cell, at different vertical levels above the substrate, and a second set of contacts arranged along a second cell boundary of the bit cell, at different vertical levels above the substrate, the first and the second boundaries being mutually opposite boundaries of the bit cell, and each set of contacts including a pull-up voltage contact connected to the pull-up transistor of the first or second stack, a pull-down voltage contact connected to the pull-down transistor of the first or second stack and a bit line contact connected to the pass transistor of the first or second stack.

13. The memory cell according to claim 12, wherein the first set of contacts and the common first source/drain contact are connected to the transistors of the first stack on opposite sides of the common gate electrode of the first stack, and wherein the second set of contacts and the common second source/drain contact are connected to the transistors of the second stack on opposite sides of the common gate electrode of the second stack.

14. A memory device including an array of memory cells, each of the memory cells according to claim 1.

15. The memory device according to claim 14, further comprising a set of contacts arranged to extend along and overlap a cell boundary between a first bit cell of the array and an adjacent second bit cell of the array, the contacts of the set being arranged at different vertical levels above the substrate and including: a pull-up voltage contact being shared by a pull-up transistor of a transistor stack of the first bit cell and a pull-up transistor of a transistor stack of the second bit cell, a pull-down voltage contact being shared by a pull-down transistor of the transistor stack of the first bit cell and a pull-down transistor of the transistor stack of the second bit cell, and a bit line contact being shared by a pass transistor of the transistor stack of the first bit cell and a pass transistor of the transistor stack of the second bit cell.

16. A memory device, comprising:
a substrate having a major surface extending in a horizontal direction;
a first stack of transistors and a second stack of transistors formed over the substrate, each of the first and second vertical stacks of transistors including:
a gate all-around pull-up transistor, a pull-down transistor and a pass transistor that are vertically stacked in a vertical direction crossing the horizontal direction,
wherein each of the transistors includes nanowire extending substantially in the horizontal direction and having a channel formed therein,
wherein the pull-up transistor and the pull-down transistor have a common gate electrode extending in the vertical direction between the pull-up transistor and the pull-down transistor,
wherein the common gate electrode surrounds the channel of the pull-up transistor and the channel of the pull-down transistor, and
wherein the pass transistor has a gate electrode that is separate from the common gate electrode and surrounds the channel of the pass transistor.

17. The memory device of claim 16, wherein the common electrode of one of the first stack of transistors or the second stack of transistors further surrounds end regions of the pull-up transistor and the pull-down transistor of the other of the first stack of transistors or the second stack of transistors.

18. The memory cell of claim 17, wherein a source/drain of the pull-up transistor of the first stack, a source/drain of the pull-down transistor of the first stack, a source/drain of the pass transistor of the first stack and the common gate electrode of the second stack are electrically interconnected, and wherein a source/drain of the pull-up transistor of the second stack, a source/drain of the pull-down transistor of the second stack, a source/drain of the pass transistor of the second stack and the common gate electrode of the first stack are electrically interconnected.

* * * * *